US007545300B2

(12) United States Patent  (10) Patent No.: US 7,545,300 B2
Boemler  (45) Date of Patent: *Jun. 9, 2009

(54) COLUMN-PARALLEL SIGMA-DELTA ANALOG-TO-DIGITAL CONVERSION WITH GAIN AND OFFSET CONTROL

(75) Inventor: Christian Boemler, Meridian, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 64 days.

This patent is subject to a terminal disclaimer.

(21) Appl. No.: 11/806,834

(22) Filed: Jun. 4, 2007

(65) Prior Publication Data
US 2008/0169952 A1 Jul. 17, 2008

Related U.S. Application Data

(63) Continuation of application No. 11/417,021, filed on May 4, 2006, now Pat. No. 7,242,332.

(51) Int. Cl.
H03M 3/00 (2006.01)
(52) U.S. Cl. .................. 341/143; 341/118; 341/155; 250/208.1; 348/308
(58) Field of Classification Search ......... 341/135–136, 341/143, 155
See application file for complete search history.

(56) References Cited

U.S. PATENT DOCUMENTS 5,565,867 A  10/1996  Tiemann
5,886,659 A  3/1999  Pain et al.
5,964,708 A  10/1999  Freeman et al.
6,081,118 A  6/2000  Kaplan
6,115,066 A  9/2000  Gowda et al.
6,194,696 B1  2/2001  Fossum et al.
6,570,617 B2  5/2003  Fossum et al.
6,583,817 B1  6/2003  Lee
6,707,410 B1 *  3/2004  Bock .................. 341/155
6,801,148 B2  10/2004  Freeman et al.
6,965,407 B2  11/2005  Boemier et al.
7,242,332 B1 *  7/2007  Boemler ............. 341/118
2006/0232676 A1  10/2006  Boemier

OTHER PUBLICATIONS

Ian Galton, "Delta-Sigma Data Conversion in Wireless Transceivers," IEEE Transactions on Microwave Theory and Techniques, vol. 50, No. 1, Jan. 2002, pp. 302-315.

(Continued)

Primary Examiner—Khai M Nguyen
(74) Attorney, Agent, or Firm—Dickstein Shapiro LLP

(57) ABSTRACT

A sigma-delta modulation sensing circuit and an analog-to-digital converter for an imager that eliminate the erroneous conversion of non-zero analog voltages to zero digital voltages is provided. The sensing circuit includes an offset branch that allows input of an offset voltage that is at least as large as a negative channel-specific offset found in a pixel signal voltage. The sensing circuit also includes a regulation branch based on a reference voltage common across multiple columns of an imager. The regulation branch has an adjustable resistance that is modulated during the sensing operation, which creates an adjustment current that is applied during the sensing operation to a reset signal. The sensing circuit and analog-to-digital converter generate digital code based on the difference between the reset voltage and the summed offset and pixel signal voltage.

20 Claims, 11 Drawing Sheets

OTHER PUBLICATIONS

Sunetra K. Mendis et al., "CMOS Active Pixel Image Sensors for Highly Integrated Imaging Systems," IEEE Journal of Solid-State Circuits, vol. 32, No. 2, Feb. 1997, pp. 187-197.

Sunetra K. Mendis et al., "Design of a low-light-level image sensor with on-chip sigma-delta analog-to-digital," Abstract, http://spie.org/scripts/abstract.pl?bibcode=1993SPIE%2e1900%2e%2e%2e31M&P..., Dec. 29, 2004, 1 page.

D. Mensa et al., "48-GHz Digital IC's and 85-GHz Baseband Amplifiers Using Transferred-Substrate HBT's," IEEE Journal of Solid-State Circuits, vol. 34, No. 9, Sep. 1999, pp. 1196-1203.

Zhimin Zhou, et al., "CMOS Active Pixel Sensor with On-Chip Successive Approximation Analog-To-Digital Converter," IEEE Transactions on Electron Devices, vol. 44, No. 10, Oct. 1997, pp. 1759-1763.

R. Gallorini et al., "A Capacitance Meter based on an Oversampling Sigma-Delta Modulator and Its Application to Capacitive Sensor Interface," IEEE, pp. 1537-1540, 2001.

J.H. Shen et al., "A High Image Rejection Continuous-Time IF Sigma-Delta ADC with Time-Sharing of Input Resistors," IEEE, pp. 109-112, 2003.

Martin A. Brooke, "Enhanced Imaging Arrays Using a Sigma Delta ADC in Si CMOS for Each Array Pixel," IEEE, pp. 11-12, 2000.

Jorge Grilo et al., "A 12-mW ADC Delta-Sigma Modulator With 80 dB of Dynamic Range Integrated in a Single-Chip Bluetooth Transceiver," IEEE Journal of Solid-State Circuits, vol. 37, No. 3, Mar. 2002, pp. 271-278.

\* cited by examiner

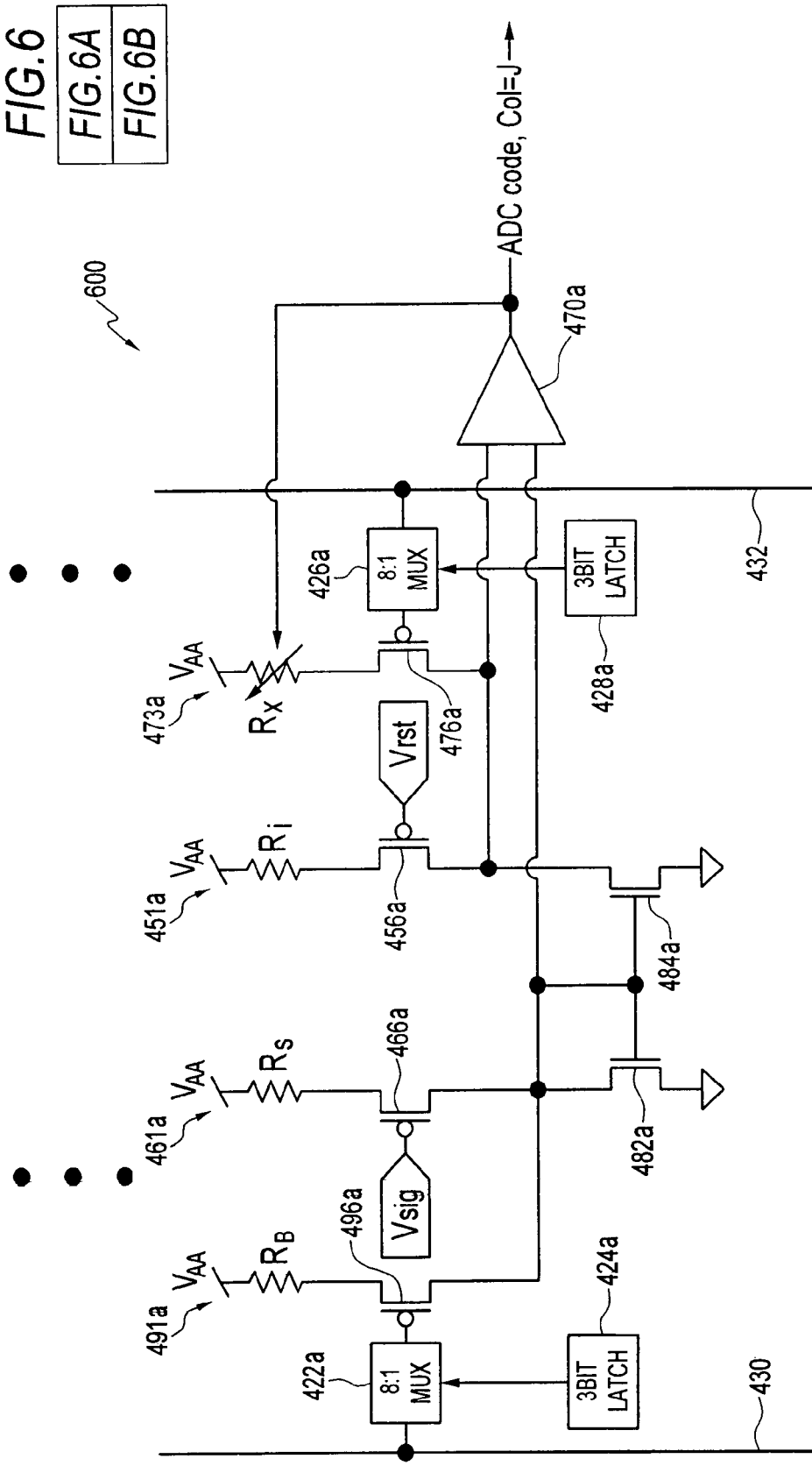

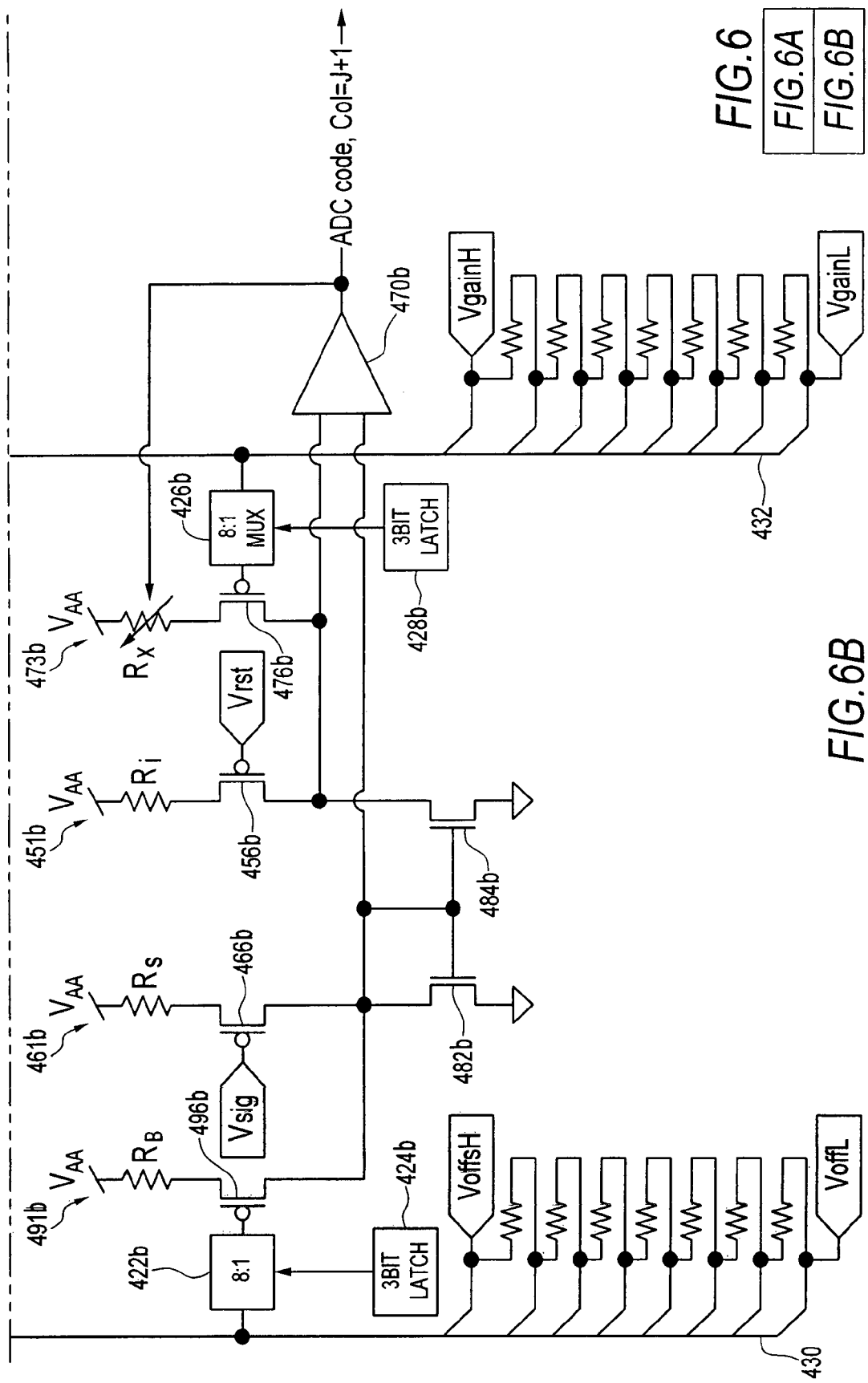

COLUMN-PARALLEL SIGMA-DELTA ANALOG-TO-DIGITAL CONVERSION WITH GAIN AND OFFSET CONTROL

CROSS-REFERENCE TO RELATED APPLICATIONS

This application is a continuation of U.S. patent application Ser. No. 11/417,021, filed on May 4, 2006, now U.S. Pat. No. 7,242,332 the subject matter of which is incorporated in its entirety by reference herein.

FIELD OF THE INVENTION

The invention relates generally to a sigma-delta analog-to-digital converter and more particularly to a sigma-delta analog-to-digital converter used in imaging devices.

BACKGROUND OF THE INVENTION

Semiconductor imagers are used in a variety of digital image capture systems, including products such as scanners, copiers, and digital cameras. A semiconductor imager typically includes an array of light-sensitive pixel cells that are electrically responsive to incident light. Each cell in a pixel cell array includes a photosensor for converting incident photons into charge. The collected charge in each cell is output as a pixel signal voltage. The collective pixel signal voltages are processed to generate a digital version of the captured image.

FIG. 1 illustrates a block diagram of an exemplary semiconductor CMOS imager 100 having a pixel array 140 comprising a plurality of pixel cells arranged in a predetermined number of columns and rows. Each pixel cell is configured to receive incident photons and to convert the incident photons into electrical signals. Pixel cells of pixel array 140 are output row-by-row as activated by a row driver 145 in response to a row address decoder 155. Column driver 160 and column address decoder 170 are also used to selectively activate individual pixel columns. A timing and control circuit 150 controls address decoders 155, 170 for selecting the appropriate row and column lines for pixel readout. The control circuit 150 also controls the row and column driver circuitry 145, 160 such that driving voltages may be applied. Each pixel cell generally outputs both a pixel reset signal $V_{rst}$ and a pixel image signal $V_{sig}$, which are read by a sample and hold circuit 161. $V_{rst}$ represents a reset state of a pixel cell. $V_{sig}$ represents the amount of charge generated by the photosensor in a pixel cell in response to applied light during an integration period. The difference between $V_{sig}$ and $V_{rst}$ represents the actual pixel cell output with common-mode noise eliminated. The differential signal ($V_{rst}$-$V_{sig}$) is produced by differential amplifier 162 for each readout pixel cell. The differential signals are then digitized by an analog-to-digital converter 175. The analog-to-digital converter 175 supplies the digitized pixel signals to an image processor 180, which forms and outputs a digital image.

The differential amplifier 162 and the analog-to-digital converter 175 may be combined into a single sigma-delta analog-to-digital converter circuit, as shown in FIGS. 2A and 2B. FIG. 2A illustrates a conventional sigma-delta sensing circuit 50 that could be used as part of a sigma-delta analog-to-digital converter. The sensing circuit 50 comprises a first branch 51 for sensing the reset signal $V_{rst}$ from a sample and hold capacitor (not shown), and a second branch 61 for sensing the pixel signal $V_{sig}$ from another sample and hold capacitor (not shown). The sensing circuit 50 also comprises a current mirror 80, a comparator 70 and a NOR gate 72. The comparator 70 may be a regenerative latch type, where the digital output is synchronized to the phase clocks. Smoothing capacitors (not shown) may also be added to the branch outputs to convert the switching nature of the currents through branches 51, 61 into near-DC currents.

The first branch 51 comprises three PMOS transistors 52, 54, 56 and a capacitor 58. The first PMOS transistor 52 is connected between a supply voltage $V_{AA}$ and a source/drain terminal of the second PMOS transistor 54. The gate of the first PMOS transistor 52 is connected to a first clock signal /PHI1. The second PMOS transistor 54 has a second source/drain terminal connected to a source/drain terminal of the third PMOS transistor 56. The gate of the second PMOS transistor 54 is connected to a second clock signal /PHI2. The capacitor 58 is connected between a ground potential and the connection between the first and second PMOS transistors 52, 54.

The second source/drain terminal of the third PMOS transistor 56 is connected to a source/drain terminal of a first NMOS transistor 82 of the current mirror 80. The gate of the third PMOS transistor 56 is connected to receive the reset signal $V_{rst}$; the third PMOS transistor 56 acts as a source follower transistor for the first branch 51. The second source/drain of the third PMOS transistor 56 is also coupled to a first input of the comparator 70.

In operation, the first clock signal /PHI1 is applied to the gate of the first PMOS transistor 52 and the second clock signal /PHI2 is applied to the gate of the second PMOS transistor 54 in a complementary non-overlapping fashion and at a specified frequency. The designations "/PHI1" and "/PHI2" are used to mean the inverted clock signal of non-overlapping clocks PHI1 and PHI2, respectively. Thus, /PHI1 and /PHI2 cannot be low at the same time. The clock signals /PHI1, /PHI2 are typically generated by a clock generator or control circuit. The two PMOS transistors 52, 54 act as switches under the control of their respective clock signals /PHI1, /PHI2. Activating the first PMOS transistor 52 (i.e., closing the switch by setting /PHI1 low) immediately after deactivating the second PMOS transistor 54 (i.e., opening the switch by setting /PHI2 high) will charge the capacitor 58. Similarly, deactivating the first PMOS transistor 52 (i.e., opening the switch) immediately before activating the second PMOS transistor 54 (i.e., closing the switch) will discharge the capacitor 58.

Using the non-overlapping complementary clock signals /PHI1, /PHI2 to open and close the "switches" (i.e., transistors 52, 54) causes the capacitor 58 to simulate a resistor (e.g., resistor $R_i$ in FIG. 2B). The equivalent resistance of the resistor $R_i$ is equal to 1/f·C, where C is the capacitance of the capacitor 58 and f is the frequency of the clock signals /PHI1, /PHI2. By varying the frequency f, the resistance may be adjusted as desired. For example, the larger the frequency f, the smaller the resistance. The changing of the resistance of the capacitor 58 is referred to as "modulating" the resistance. A reset current $I_R$ based on the resistance of the first branch 51 and the reset voltage $V_{rst}$ flows through the first branch 51 to the comparator 70.

The second branch 61 comprises three PMOS transistors 62, 64, 66 and a capacitor 68. The fourth PMOS transistor 62 is connected between the supply voltage $V_{AA}$ and a source/drain terminal of the fifth PMOS transistor 64. The gate of the fourth PMOS transistor 62 is connected to the first clock signal /PHI1. The fifth PMOS transistor 64 has a second source/drain terminal connected to a source/drain terminal of the sixth PMOS transistor 66. The gate of the fifth PMOS transistor 64 is connected the output of the NOR gate 72. The second capacitor 68 is connected between a ground potential and the connection between the fourth and fifth PMOS transistors 62, 64.

The second source/drain terminal of the sixth PMOS transistor 66 is connected to a source/drain terminal of a second NMOS transistor 84 of the current mirror 80. The gate of sixth PMOS transistor 66 is connected to receive the pixel signal $V_{sig}$; the sixth PMOS transistor 66 acts as a source follower transistor for the second branch 61. The second source/drain of the sixth PMOS transistor 66 is also coupled to a second input of the comparator 70. The output of the comparator 70 is connected to a first input of the NOR gate 72. The non-inverted second clock signal PHI2 is connected to a second input of the NOR gate 72.

In operation, the first clock signal /PHI1 is applied to the gate of the fourth PMOS transistor 62. The output of the NOR gate 72, which is essentially clocked by the non-inverted second clock signal PHI2, is applied to the gate of the fifth PMOS transistor 64. As set forth above, the clock signals /PHI1, /PHI2 are non-overlapping complementary signals. The two PMOS transistors 62, 64 act as switches, where the fourth PMOS transistor 62 is controlled by the first clock signal /PHI1 and the fifth PMOS transistor 64 is controlled by the output of the NOR gate 72 (as clocked by PHI2). Activating the fourth PMOS transistor 62 (i.e., closing the switch) immediately after deactivating the fifth PMOS transistor 64 (i.e., opening the switch) will charge the capacitor 68. Similarly, deactivating the fourth PMOS transistor 62 (i.e., opening the switch) immediately before activating the fifth PMOS transistor 64 (i.e., closing the switch) will discharge the capacitor 68.

Using the non-overlapping complementary clock signals /PHI1, /PHI2 (and the output of the comparator 70) to open and close the "switches" (i.e., transistors 62, 64) causes the capacitor 68 to simulate a resistor (e.g., resistor $R_x$ in FIG. 2B) with an equivalent resistance equal to 1/f·C, where C is the capacitance of the capacitor 68 and f is the average frequency of the clock signal output from the NOR gate 72. As set forth above, by varying the frequency f, the resistance may be adjusted or modulated as desired. A pixel signal current $I_S$ based on the resistance of the second branch 61 and the $V_{sig}$ voltage level flows through the second branch 61 to the comparator 70.

The operation of the sensing circuit is now explained in more detail with reference to FIG. 2B. FIG. 2B illustrates a conventional sigma-delta analog-to-digital converter 100 using the FIG. 2A sigma-delta sensing circuit 50. Portions of the sensing circuit 50 illustrated in FIG. 2A have been replaced by their functional equivalents in FIG. 2B. For example, in FIG. 2B, a first resistor $R_i$ replaces the first switched capacitor 58 and the first and second PMOS transistors 52, 54 shown in FIG. 2A. Likewise, in FIG. 2B, a second resistor $R_x$, shown as an adjustable resistor, replaces the second switched capacitor 68 and the fourth and fifth PMOS transistors 62, 64 shown in FIG. 2A. The NOR gate 72 is also not shown in FIG. 2B. The analog-to-digital converter 100 also includes a counter 90 connected to the output of the comparator 70.

The sensing circuit 50, and as such, the analog-to-digital converter 100, operates based on a sigma-delta modulation approach. In principle, the sensing circuit 50 attempts to get the reset signal current $I_R$ and the pixel signal current $I_S$ to be the same. Since typically it is most likely that the reset signal voltage $V_{rst}$ will be larger than the pixel signal voltage $V_{sig}$, the sensing circuit 50 needs to modulate the resistance of one of the branches 51, 61 to maintain identical $I_R$ and $I_S$ currents. In the illustrated example, the sensing circuit 50 can increase the resistance $R_x$ associated with the switched capacitor 68 (FIG. 2A) of the second branch 61 by occasionally skipping clocks to the gate of PMOS transistor 64. The counter 90 keeps track of the number, M, of times the resistance $R_x$ is adjusted over a predetermined number of clock cycles N. The number of clock cycles N is typically equal to $2^n$, where n is the number of bits of resolution in the analog-to-digital converter 100. The number M of times the resistance $R_x$ is changed, can be used by the counter 90 to generate a digital code ADC CODE corresponding to the actual light impinging on the pixel.

The operation of the sensing circuit 50 can be expressed by the following current equations:

$$\frac{V_{AA} - V_{sig} - V_{tp66}}{R_x} = \frac{V_{AA} - V_{rst} - V_{tp56}}{R_i} \quad \text{Equation 1.}$$

where $V_{tp66}$ is the threshold voltage of the sixth PMOS transistor 66 and $V_{tp56}$ is the threshold voltage of the third PMOS transistor 56. This equation becomes:

$$V_{AA} - V_{sig} - V_{tp66} = (V_{AA} - V_{rst} - V_{tp56})\frac{R_x}{R_i} \quad \text{Equation 2.}$$

It is known that the ratio of the resistance $R_i$ to resistance $R_x$ is inversely proportional to the number, M, of times the resistance $R_x$ is adjusted over a predetermined number of clock cycles N. As such, equation (2) becomes:

$$\frac{R_i}{R_x} = \frac{M}{N} = \frac{V_{AA} - V_{rst} - V_{tp56}}{V_{AA} - V_{sig} - V_{tp66}} \quad \text{Equation 3.}$$

Although the sigma-delta sensing circuit 50 and the sigma-delta analog-to-digital converter 100 operate effectively to produce a digital code ADC CODE representing the light impinging on a pixel, they are not without their shortcomings. For example, as shown in the above equations, the output code ADC CODE is essentially based on the ratio of the $V_{sig}$ and $V_{rst}$ voltages. These voltages, however, may have been adversely impacted by noise during the readout and/or sample and hold operations, which is stored in the $V_{rst}$ and $V_{sig}$ signals. This noise, therefore, factors into the operation of the sensing circuit 50 (and the analog-to-digital converter 100), which may cause undesirable results.

BRIEF DESCRIPTION OF THE DRAWINGS

FIGS. 6A and 6B depict a multi-channel sigma-delta analog-to-digital converter according to an exemplary embodiment of the invention.

DETAILED DESCRIPTION OF THE INVENTION

Figure 2A:
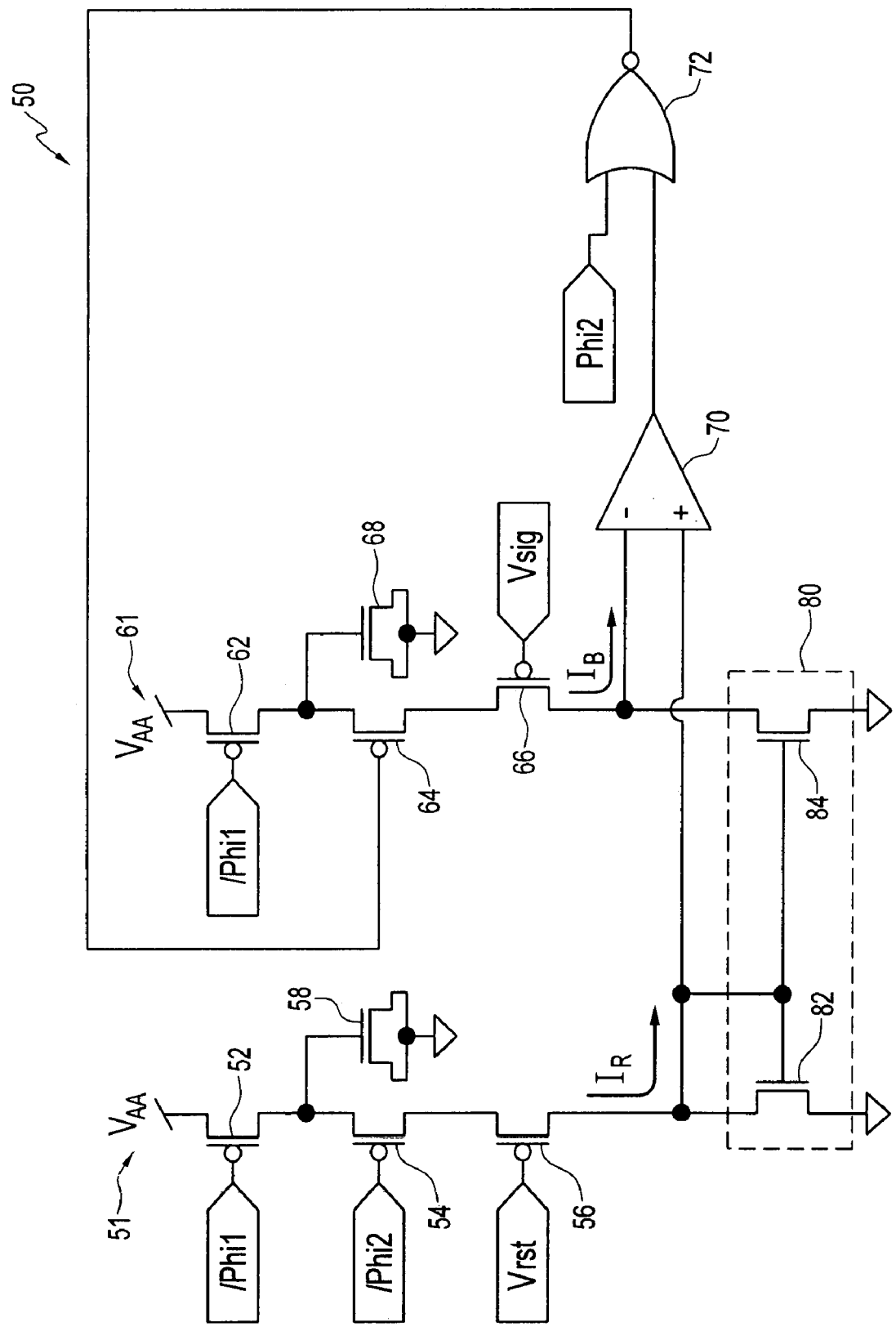
FIGS. 2A and 2B are circuit diagrams of a conventional sigma-delta analog-to-digital converter.
Figure 2B:
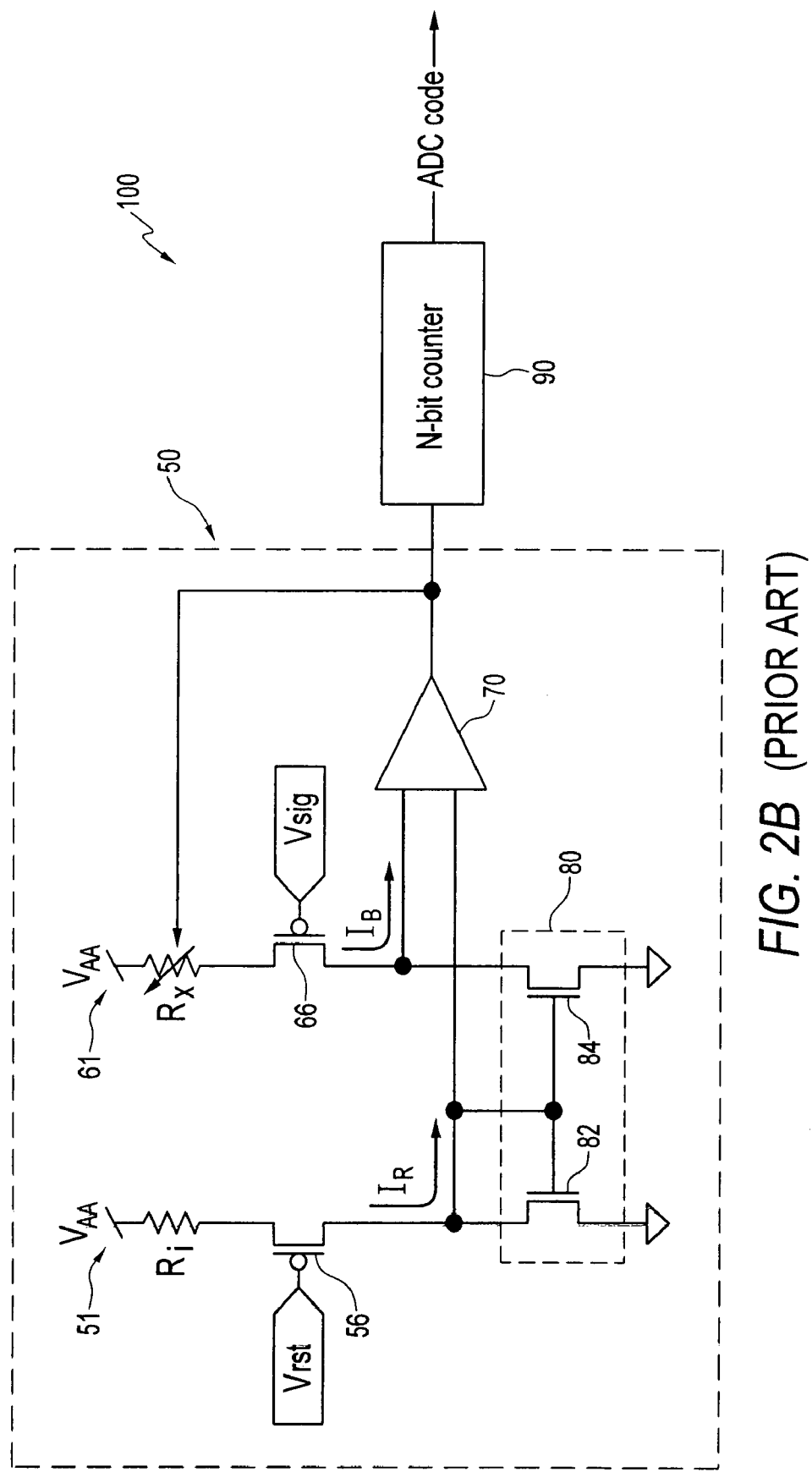
Figure 3A:
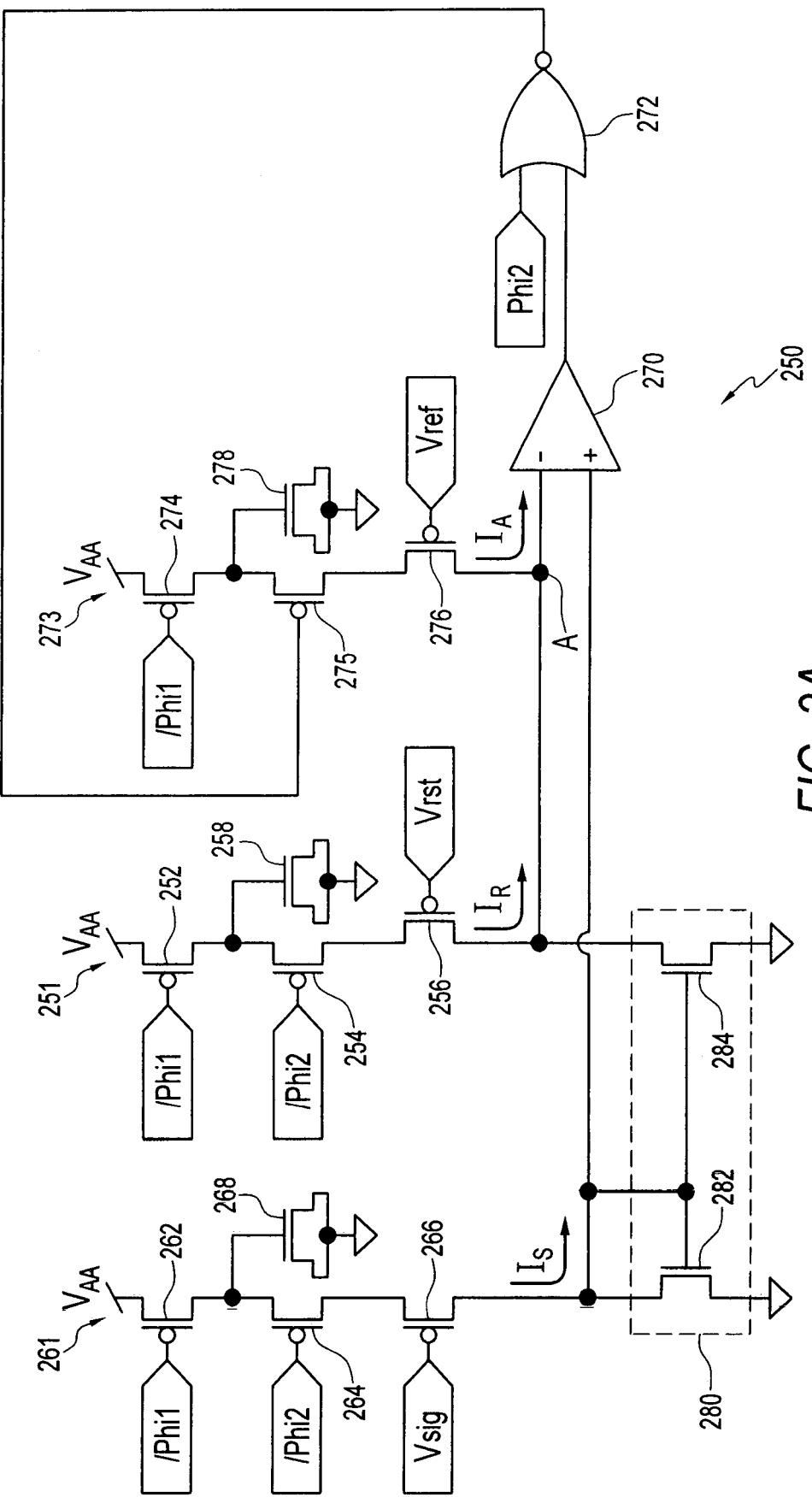
FIGS. 3A and 3B are circuit diagrams of an exemplary sigma-delta analog-to-digital converter.
Figure 3B:
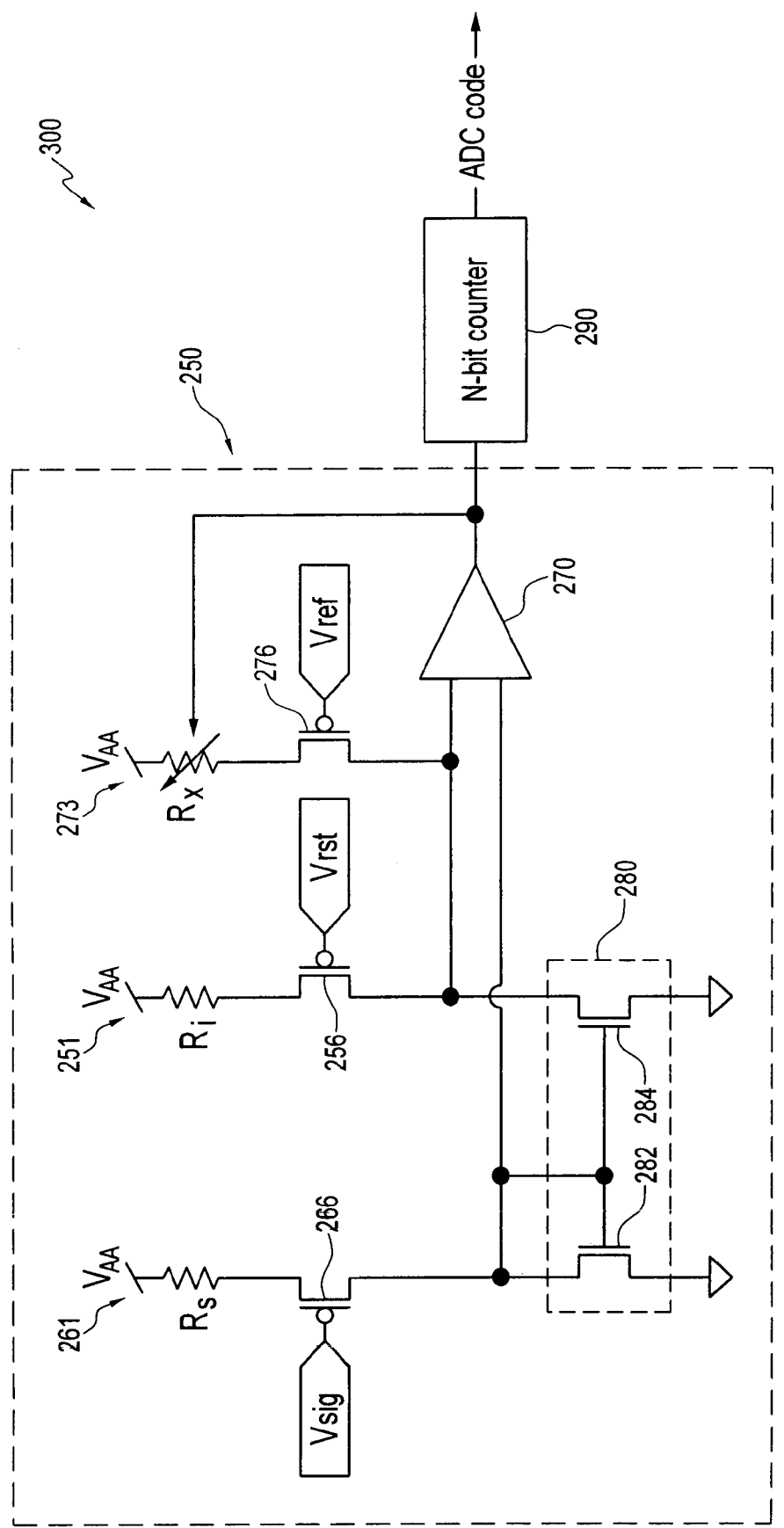

One method of improving upon the conventional sensing circuit sigma-delta analog-to-digital converter of FIGS. 2A and 2B is presented in U.S. patent application Ser. No. 11/106,465, filed Apr. 15, 2005. The '465 method is also demonstrated in FIGS. 3A and 3B. FIG. 3A depicts a sensing circuit 250 and FIG. 3B depicts a sigma-delta analog-to-digital converter 300 that includes sensing circuit 250. The sensing circuit 250 comprises a first branch 251 for sensing the reset signal $V_{rst}$ from a sample and hold capacitor (not shown), a second branch 261 for sensing the pixel signal $V_{sig}$ from another sample and hold capacitor (not shown) and a regulation branch 273. The sensing circuit 250 also comprises a current mirror 280, a comparator 270 and a NOR gate 272. The comparator 270 is preferably a regenerative latch type comparator, where the digital output is synchronized to the phase clocks.

The first branch 251 comprises three PMOS transistors 252, 254, 256 and a capacitor 258. The first PMOS transistor 252 is connected between a supply voltage $V_{AA}$ and a source/drain terminal of the second PMOS transistor 254. The gate of the first PMOS transistor 252 is connected to a first clock signal /PHI1. The second PMOS transistor 254 has a second source/drain terminal connected to a source/drain terminal of the third PMOS transistor 256. The gate of the second PMOS transistor 254 is connected to a second clock signal /PHI2. The capacitor 258 is connected between a ground potential and the connection between the first and second PMOS transistors 252, 254.

The second source/drain terminal of the third PMOS transistor 256 is connected to a source/drain terminal of a second NMOS transistor 284 of the current mirror 280. The gate of the third PMOS transistor 256 is connected to receive the reset signal $V_{rst}$; the third PMOS transistor 256 acts as a source follower transistor for the first branch 251. The second source/drain of the third PMOS transistor 256 is also coupled to a node A, which is coupled to a first input of the comparator 270.

In operation, the first clock signal /PHI1 is applied to the gate of the first PMOS transistor 252 and the second clock signal /PHI2 is applied to the gate of the second PMOS transistor 254 in a complementary non-overlapping fashion and at a specified frequency. The designations "/PHI1" and "/PHI2" are used to mean the inverted clock signal of non-overlapping clock signals PHI1 and PHI2, respectively. Thus, /PHI1 and /PHI2 cannot be low at the same time. The clock signals /PHI1, /PHI2 are typically generated by a clock generator or control circuit (e.g., timing and control circuit 150 of FIG. 1). The two PMOS transistors 252, 254 act as switches under the control of their respective clock signals /PHI1, /PHI2. Activating the first PMOS transistor 252 (i.e., closing the switch) immediately after deactivating the second PMOS transistor 254 (i.e., opening the switch) will charge the capacitor 258. Similarly, deactivating the first PMOS transistor 252 (i.e., opening the switch) immediately before activating the second PMOS transistor 254 (i.e., closing the switch) will discharge the capacitor 258.

Using the non-overlapping complementary clock signals /PHI1, /PHI2 to open and close the "switches" (i.e., transistors 252, 254) causes the capacitor 258 to simulate a resistor (e.g., resistor $R_i$ in FIG. 3B). The equivalent resistance of the resistor $R_i$ is equal to 1/f·C, where C is the capacitance of the capacitor 258 and f is the frequency of the clock signals /PHI1, /PHI2. By varying the frequency f, the resistance may be adjusted or modulated as desired. A reset current $I_R$ based on the resistance of the first branch 251 and the $V_{rst}$ voltage level flows through the first branch 251 to node A.

The second branch 261 comprises three PMOS transistors 262, 264, 266 and a capacitor 268. The fourth PMOS transistor 262 is connected between the supply voltage $V_{AA}$ and a source/drain terminal of the fifth PMOS transistor 264. The gate of the fourth PMOS transistor 262 is connected to the first clock signal /PHI1. The fifth PMOS transistor 264 has a second source/drain terminal connected to a source/drain terminal of the sixth PMOS transistor 266. The gate of the fifth PMOS transistor 264 is connected the second clock signal /PHI2. The second capacitor 268 is connected between a ground potential and the connection between the fourth and fifth PMOS transistors 262, 264.

The second source/drain terminal of the sixth PMOS transistor 266 is connected to a source/drain terminal of a first NMOS transistor 282 of the current mirror 280. The gate of sixth PMOS transistor 266 is connected to receive the pixel signal $V_{sig}$, where the sixth PMOS transistor 266 acts as a source follower transistor for the second branch 261. The second source/drain of the sixth PMOS transistor 266 is also coupled to a second input of the comparator 270. The output of the comparator 270 is connected to a first input of the NOR gate 272. The second non-inverted clock signal PHI2 is connected to a second input of the NOR gate 272.

In operation, the first clock signal /PHI1 is applied to the gate of the fourth PMOS transistor 262 while the second clock signal /PHI2 is applied to the gate of the fifth PMOS transistor 264. As set forth above, the clock signals /PHI1, /PHI2 are non-overlapping complementary signals. The two PMOS transistors 262, 264 act as switches, where the fourth PMOS transistor 262 is controlled by the first clock signal /PHI1 and the fifth PMOS transistor 264 is controlled by the second clock signal /PHI2. Activating the fourth PMOS transistor 262 (i.e., closing the switch) immediately after deactivating the fifth PMOS transistor 264 (i.e., opening the switch) will charge the capacitor 268. Similarly, deactivating the fourth PMOS transistor 262 (i.e., opening the switch) immediately before activating the fifth PMOS transistor 264 (i.e., closing the switch) will discharge the capacitor 268.

Using the non-overlapping complementary clock signals /PHI1, /PHI2 to open and close the "switches" (i.e., transistors 262, 264) causes the capacitor 268 to simulate a resistor (e.g., resistor $R_s$ in FIG. 3B) with an equivalent resistance equal to 1/f·C, where C is the capacitance of the capacitor 268 and f is the frequency of the clock signals /PHI1, /PHI2. As set forth above, by varying the frequency f, the resistance may be adjusted or modulated as desired. A pixel signal current $I_S$ based on the resistance of the second branch 261 and the $V_{sig}$ voltage level flows through the second branch 261 to the comparator 270.

The regulation branch 273 comprises three PMOS transistors 274, 275, 276 and a capacitor 278. The seventh PMOS transistor 274 is connected between the supply voltage $V_{AA}$ and a source/drain terminal of the eighth PMOS transistor 275. The gate of the seventh PMOS transistor 274 is connected to the first clock signal /PHI1. The eighth PMOS transistor 275 has a second source/drain terminal connected to a source/drain terminal of the ninth PMOS transistor 276. The gate of the eighth PMOS transistor 275 is connected to the output of the NOR gate 272. The third capacitor 278 is connected between a ground potential and the connection between the seventh and eighth PMOS transistors 274, 275.

The second source/drain terminal of the ninth PMOS transistor 276 is connected to node A and the first input of the comparator 270. The gate of ninth PMOS transistor 276 is connected to receive a reference voltage $V_{ref}$. Preferably, the reference voltage $V_{ref}$ is common to all columns of a pixel array of the imager. The ninth PMOS transistor 276 acts as a source follower transistor for the regulation branch 273.

In operation, the first clock signal /PHI1 is applied to the gate of the seventh PMOS transistor 274. The output of the NOR gate 272, which is either high or pulses low while PHI2 is low depending upon the output of the comparator 270, is applied to the gate of the eighth PMOS transistor 275. The two PMOS transistors 274, 275 act as switches, where the seventh PMOS transistor 274 is controlled by the first clock signal /PHI1 and the eighth PMOS transistor 275 is controlled by the output of the NOR gate 272 (as clocked by PHI2). Activating the seventh PMOS transistor 274 (i.e., closing the switch) immediately after deactivating the eighth PMOS transistor 275 (i.e., opening the switch) will charge the third capacitor 278. Similarly, deactivating the seventh PMOS transistor 274 (i.e., opening the switch) immediately before activating the eighth PMOS transistor 275 (i.e., closing the switch) will discharge the third capacitor 278. The comparator 270 triggers the output of the NOR gate 272 when the reset signal current $I_R$ is less than the pixel signal current $I_S$ (but only when the second clock signal /PHI2 has a logic state that would activate the eighth PMOS transistor 275).

Using the non-overlapping complementary clock signals /PHI1, /PHI2 (and the output of the comparator 270) to open and close the "switches" (i.e., transistors 274, 275) causes the capacitor 278 to simulate a resistor (e.g., resistor $R_x$ in FIG. 3B) with an equivalent resistance equal to 1/f·C, where C is the capacitance of the capacitor 278 and f is the frequency of the clock signals /PHI1, /PHI2. As set forth above, by varying the frequency f, the resistance may be adjusted or modulated as desired. An adjustment current $I_A$ based on the resistance of the regulation branch 273 and the reference voltage $V_{ref}$ flows through the regulation branch 273 to node A where it combines with the reset current $I_R$. Thus, as is described below in more detail, the regulation branch 273 regulates the sum of the adjustment current $I_A$ and $I_R$ to be equal to $I_S$ by adjusting $I_A$ based on the outputs of the comparator 270, NOR gate 272 and the reference voltage $V_{ref}$.

The operation of the sensing circuit 250 is now explained in more detail with reference to FIG. 3B. FIG. 3B illustrates a sigma-delta analog-to-digital converter 300 using the FIG. 3A sigma-delta sensing circuit 250. Portions of the sensing circuit 250 illustrated in FIG. 3A have been replaced by their functional equivalents in FIG. 3B. For example, in FIG. 3B, a first resistor $R_i$ replaces the first switched capacitor 258 and the first and second PMOS transistors 252, 254 shown in FIG. 3A. Likewise, in FIG. 3B, a second resistor $R_s$ replaces the second switched capacitor 268 and the fourth and fifth PMOS transistors 262, 264 shown in FIG. 3A. Moreover, in FIG. 3B, a third resistor $R_x$, shown as an adjustable resistor, replaces the third switched capacitor 278 and the seventh and eighth PMOS transistors 274, 275 shown in FIG. 3A. The NOR gate 272 is also not shown in FIG. 3B. The illustrated analog-to-digital converter 300 also includes a counter 290 connected to the output of the comparator 270.

The sensing circuit 250, and as such, the analog-to-digital converter 300, operates based on a sigma-delta modulation approach. In principle, the sensing circuit 250 attempts to get the reset signal current $I_R$ plus adjustment current $I_A$ to be equal to the pixel signal current $I_S$. Because the reset voltage is generally greater than the signal voltage, using p-channel transistors will result in generating a reset signal current $I_R$ that is most likely less than the pixel signal current $I_S$. The sensing circuit 250 adds the adjustment current $I_A$ to the reset signal current $I_R$ during the sense operation.

This is achieved by modulating the resistance of the regulation branch 273 such that the branch creates a suitable adjustment current $I_A$ over the course of the sensing operation. The counter 290 keeps track of the number, M, of times the resistance $R_x$ is adjusted over a predetermined number of clock cycles N. The number of clock cycles N is typically equal to $2^n$, where n is the number of bits of resolution in the analog-to-digital converter 300. The number M of times the resistance $R_x$ is changed directly corresponds to the difference between the pixel signal voltage $V_{sig}$ and the reset signal voltage $V_{rst}$. As such, the number M of times the resistance $R_x$ is changed will be used by the counter 290 to generate a digital code analog-to-digital converter code corresponding to the actual light impinging on the pixel.

The operation of the sensing circuit 250 can be expressed by the following current equations:

$$\frac{V_{AA} - V_{sig} - V_{tp266}}{R_s} = \frac{V_{AA} - V_{rst} - V_{tp256}}{R_i} + \frac{V_{AA} - V_{ref} - V_{tp276}}{R_x} \quad \text{Equation 4.}$$

where $V_{tp266}$ is the threshold voltage of the sixth PMOS transistor 266, $V_{tp256}$ is the threshold voltage of the third PMOS transistor 256 and $V_{tp276}$ is the threshold voltage of the ninth PMOS transistor 276. Preferably, $R_s = R_i$. Thus, Equation 4 becomes:

$$(V_{AA} - V_{sig} - V_{tp266}) - (V_{AA} - V_{rst} - V_{tp256}) = (V_{AA} - V_{ref} - V_{tp276})\frac{R_i}{R_x} \quad \text{Equation 5.}$$

It is known that the ratio of the resistance $R_i$ to resistance $R_x$ is proportional to the number, M, of times the resistance $R_x$ is adjusted over a predetermined number of clock cycles N. In addition, $V_{tp266}$ is assumed equal to $V_{tp256}$. As such, Equation 5 becomes:

$$\frac{R_i}{R_x} = \frac{M}{N} = \frac{V_{rst} - V_{sig}}{V_{AA} - V_{ref} - V_{tp276}} \quad \text{Equation 6.}$$

As such, the sigma-delta modulation sensing operation is based on the difference between the reset signal voltage $V_{rst}$ and the pixel signal voltage $V_{sig}$ as opposed to a ratio of these two voltages. Thus, the sensing circuit 250 provides for a "true" subtraction between the reset signal voltage $V_{rst}$ and the pixel signal voltage $V_{sig}$. Using the difference between the reset signal voltage $V_{rst}$ and the pixel signal voltage $V_{sig}$ means that noise associated with both of these signals is subtracted out and not carried into the analog-to-digital conversion process. In addition, the denominator of Equation 6 is based on the reference voltage $V_{ref}$ and not the reset signal voltage $V_{rst}$ or the pixel signal voltage $V_{sig}$.

Figure 1:
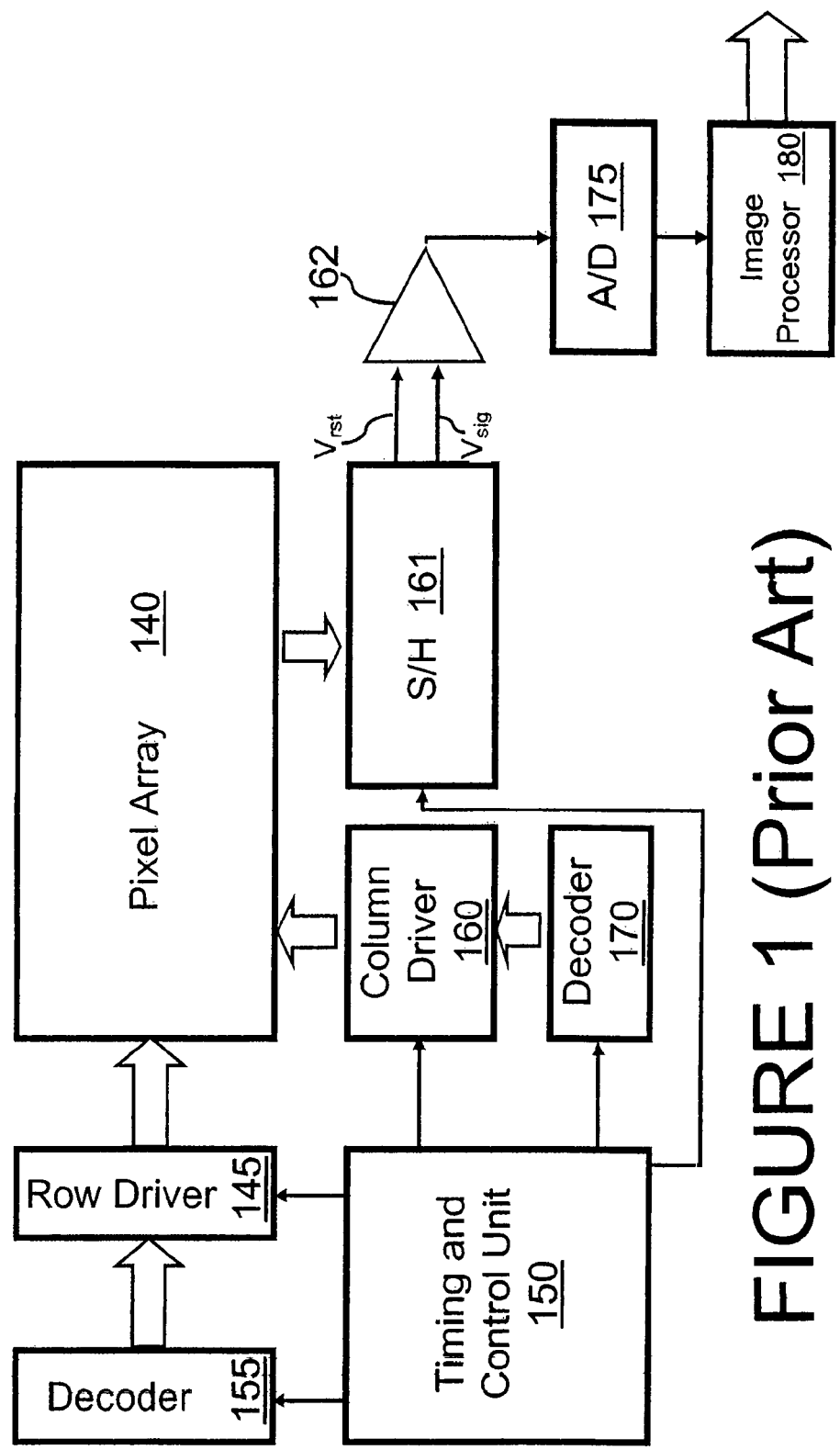
FIG. 1 is a block diagram of an exemplary CMOS imager.

It should be appreciated, however, that process variations could cause $V_{tp256}$ to be different than $V_{tp266}$ across columns in a pixel array (e.g., pixel array 140 of FIG. 1). Accordingly, mechanisms to counteract any variations between the threshold voltages $V_{tp256}$, $V_{tp266}$ on a column by column basis may be provided. For instance, the image processor (e.g., image processor 180 of FIG. 1) or other processing unit may retain offsets or other adjustment values to provide a digital adjustment for these variations based on calibration or other testing results. However, as is explained in detail below, it is desirable to account for the process variations before the analog-to-digital conversion occurs.

When differences between $V_{tp256}$ and $V_{tp266}$ are not accounted for, the pixel signals $V_{sig}$ from corresponding columns in a pixel array could vary significantly despite both columns being subject to a uniform light input. Some columns may have a negative offset. In the circuit described in FIGS. 3A and 3B, the combination of a negative column offset and a low pixel signal $V_{sig}$ could result in an analog-to-digital converter code of zero. In other words, the analog-to-digital converter outputs a zero for both a zero signal and low-level signals that are not greater than the column offset value. When a digital zero is output for a greater than normal range of positive analog inputs, the digital output is referred to as a "fat zero." Fat zeros are highly undesirable since a typical column-wise post-processing digital gain or offset correction memory is unable to compensate for the negative offset.

Figure 4:
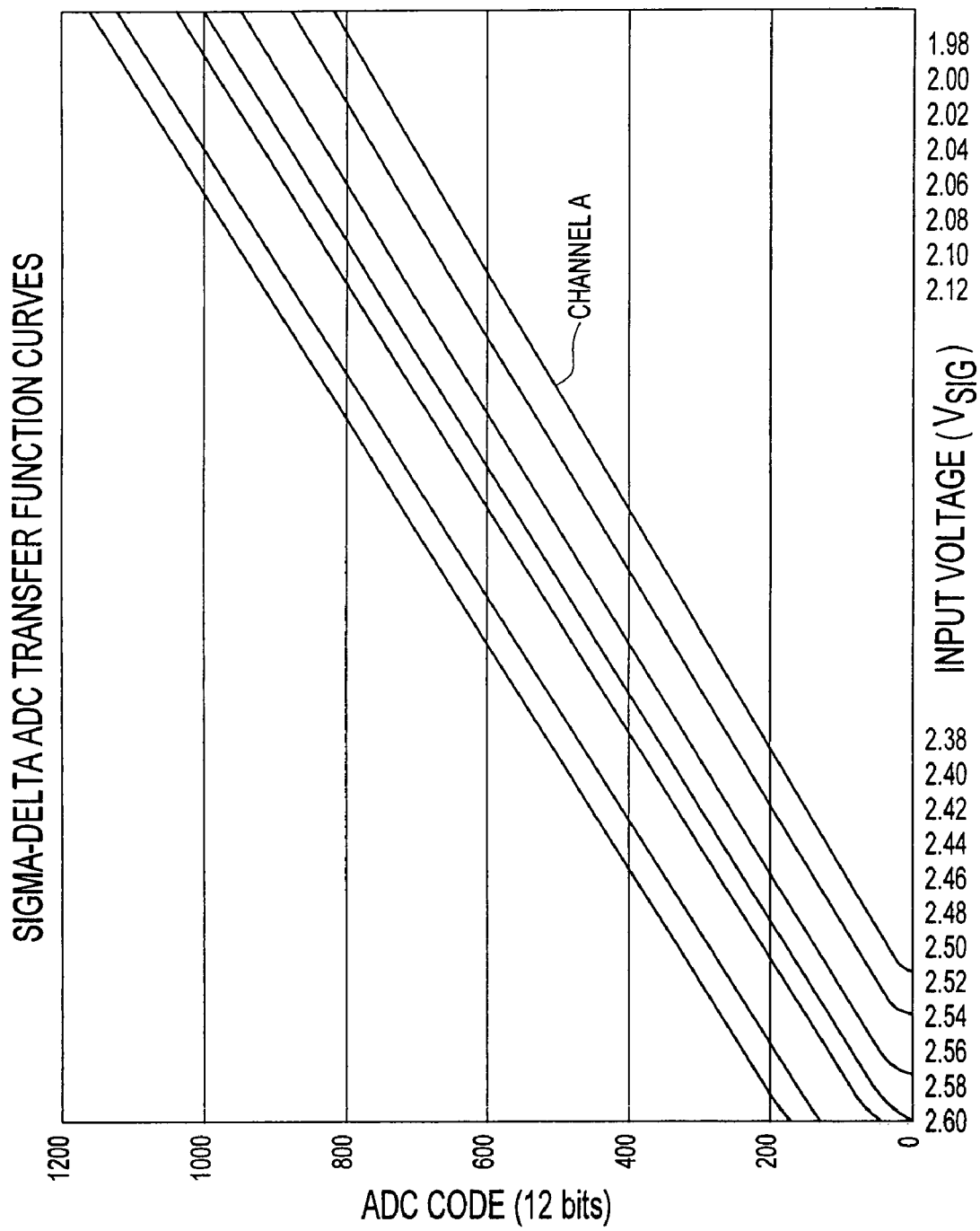
FIG. 4 is a transfer curve diagram for multiple channels of an exemplary sigma-delta analog-to-digital converter.

FIG. 4 demonstrates the problem associated with fat zeros. FIG. 4 shows a series of transfer function curves for various channels in an analog-to-digital converter of the type shown in FIG. 3B. Each transfer function curve reflects the digital output (on the vertical axis) corresponding to a specific analog input in the form of $V_{sig}$ (on the horizontal axis). For each curve, $V_{rst}$ was maintained at 2.6 V. Ideally, each curve should be identical and should intersect the horizontal axis at exactly 2.6 V (the digital output of the difference between $V_{sig}$ at 2.6 V and $V_{rst}$ should be zero). However, as FIG. 4 shows, the transfer function curves intersect the horizontal axis across a range of $V_{sig}$ values. Most problematic are those transfer function curves that intersect the horizontal axis at a $V_{sig}$ value less than the $V_{rst}$ value of 2.6 V. The analog-to-digital converter channels corresponding to these low-shifted transfer functions will output a digital zero for a range of values less than $V_{rst}$. For example, channel A will output a digital zero as long as $V_{sig}$ is greater than about 2.53 V. In other words, low light conditions will result in a fat zero for channel A.

In order to reduce the probabilities that fat zeros will occur, the sensing circuit sigma-delta analog-to-digital converter of FIGS. 3A and 3B is modified to include a fourth circuit branch. The fourth branch allows a positive offset to be provided to the pixel signal $V_{sig}$, wherein the offset is chosen to be sufficiently large so as to reduce or eliminate the occurrence of fat zeros.

Figure 5A:
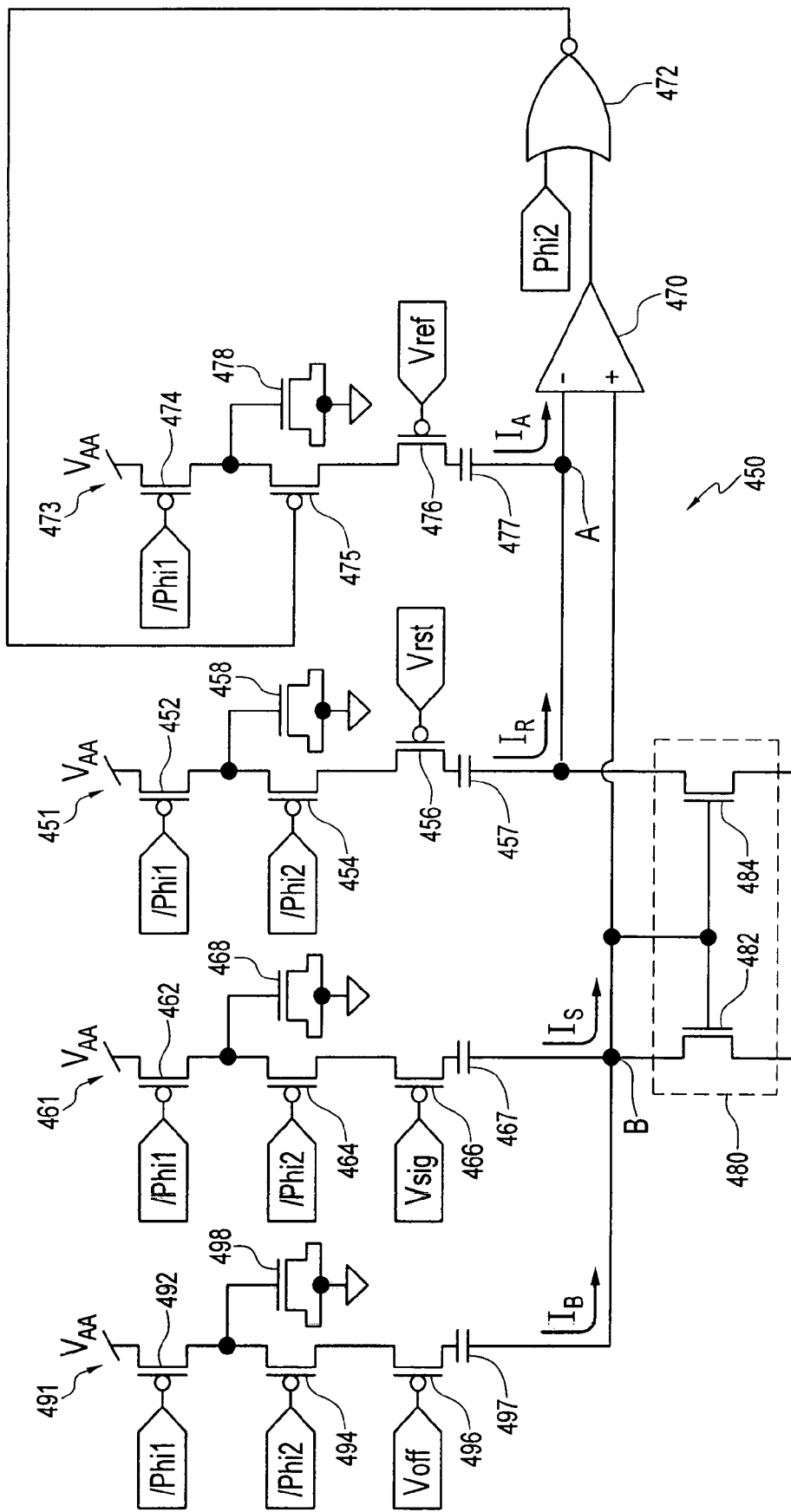
FIGS. 5A and 5B are circuit diagrams of a sigma-delta analog-to-digital converter according to an exemplary embodiment of the invention.

FIG. 5A depicts a sensing circuit 450 according to an exemplary embodiment of the invention. The sensing circuit 450 comprises a first branch 451 for sensing the reset signal $V_{rst}$ from a sample and hold capacitor (not shown), a second branch 461 for sensing the pixel signal $V_{sig}$ from another sample and hold capacitor (not shown), a regulation branch 473 and an offset branch 491. The sensing circuit 450 also comprises a current mirror 480, a comparator 470 and a NOR gate 472. The comparator 470 is preferably a regenerative latch type comparator, where the digital output is synchronized to the phase clocks. Smoothing capacitors 457, 467, 477, 497 are preferably added to each branch output to convert the switching nature of the currents through branches 451, 461, 473, 491, respectively, into near-DC currents.

The first branch 451 comprises three PMOS transistors 452, 454, 456 and a capacitor 458. The first PMOS transistor 452 is connected between a supply voltage $V_{AA}$ and a source/drain terminal of the second PMOS transistor 454. The gate of the first PMOS transistor 452 is connected to a first clock signal /PHI1. The second PMOS transistor 454 has a second source/drain terminal connected to a source/drain terminal of the third PMOS transistor 456. The gate of the second PMOS transistor 454 is connected to a second clock signal /PHI2. The capacitor 458 is connected between a ground potential and the connection between the first and second PMOS transistors 452, 454.

The second source/drain terminal of the third PMOS transistor 456 is connected to a source/drain terminal of a second NMOS transistor 484 of the current mirror 480. The gate of the third PMOS transistor 456 is connected to receive the reset signal $V_{rst}$; the third PMOS transistor 456 acts as a source follower transistor for the first branch 451. The second source/drain of the third PMOS transistor 456 is also coupled to a node A, which is coupled to a first input of the comparator 470.

In operation, the first clock signal /PHI1 is applied to the gate of the first PMOS transistor 452 and the second clock signal /PHI2 is applied to the gate of the second PMOS transistor 454 in a complementary non-overlapping fashion and at a specified frequency. The designations "/PHI1" and "/PHI2" are used to mean the inverted clock signal of non-overlapping clock signals PHIL and PHI2, respectively. Thus, /PHI1 and /PHI2 cannot be low at the same time. The clock signals /PHI1, /PHI2 are typically generated by a clock generator or control circuit (e.g., timing and control circuit 150 of FIG. 1). The two PMOS transistors 452, 454 act as switches under the control of their respective clock signals /PHI1, /PHI2. Activating the first PMOS transistor 452 (i.e., closing the switch) immediately after deactivating the second PMOS transistor 454 (i.e., opening the switch) will charge the capacitor 458. Similarly, deactivating the first PMOS transistor 452 (i.e., opening the switch) immediately before activating the second PMOS transistor 454 (i.e., closing the switch) will discharge the capacitor 458.

Figure 5B:
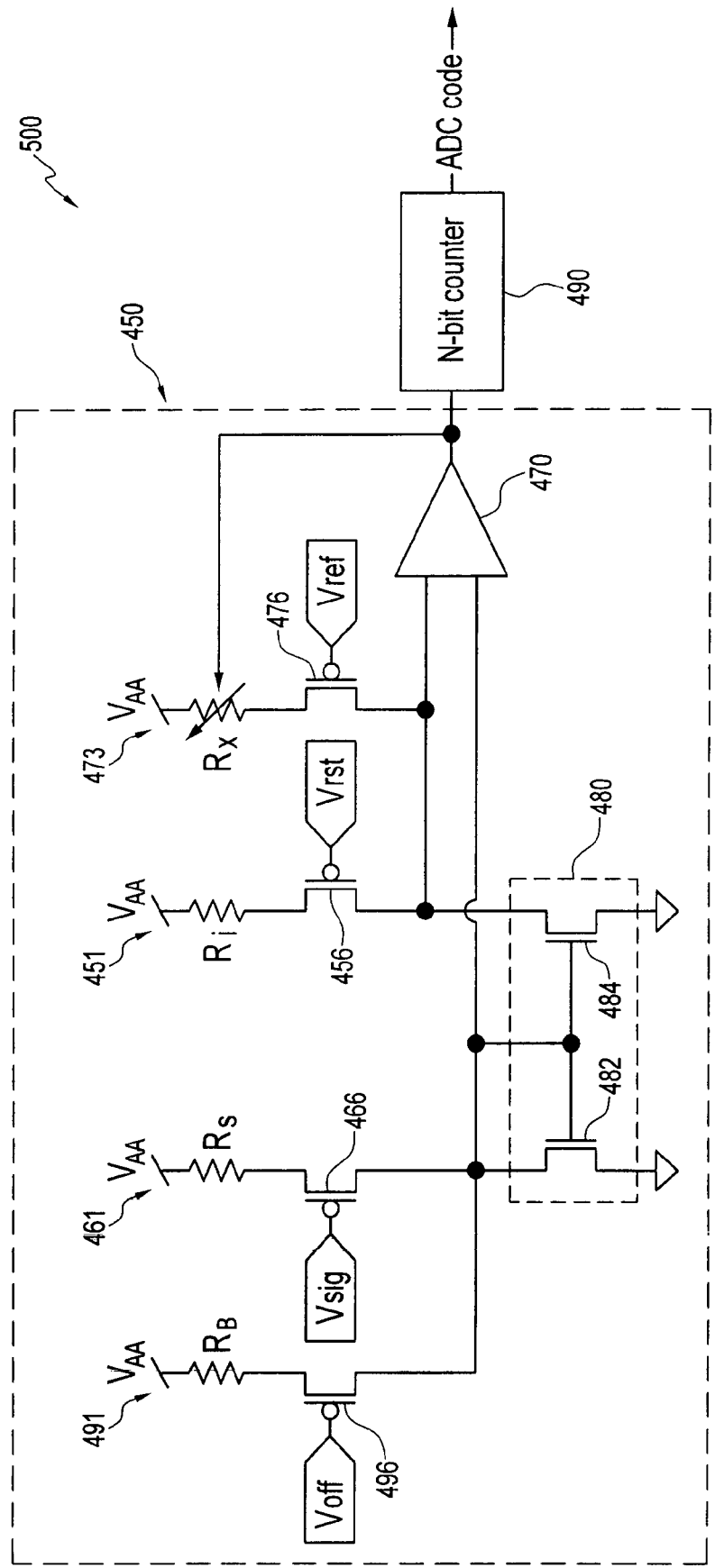

Using the non-overlapping complementary clock signals /PHI1, /PHI2 to open and close the "switches" (i.e., transistors 452, 454) causes the capacitor 458 to simulate a resistor (e.g., resistor $R_i$ in FIG. 5B). The equivalent resistance of the resistor $R_i$ is equal to $1/f \cdot C$, where C is the capacitance of the capacitor 458 and f is the frequency of the clock signals /PHI1, /PHI2. By varying the frequency f, the resistance may be adjusted or modulated as desired. A reset current $I_R$ based on the resistance of the first branch 451 and the $V_{rst}$ voltage level flows through the first branch 451 to node A.

The second branch 461 comprises three PMOS transistors 462, 464, 466 and a capacitor 468. The fourth PMOS transistor 462 is connected between the supply voltage $V_{AA}$ and a source/drain terminal of the fifth PMOS transistor 464. The gate of the fourth PMOS transistor 462 is connected to the first clock signal /PHI1. The fifth PMOS transistor 464 has a second source/drain terminal connected to a source/drain terminal of the sixth PMOS transistor 466. The gate of the fifth PMOS transistor 464 is connected the second clock signal /PHI2. The second capacitor 468 is connected between a ground potential and the connection between the fourth and fifth PMOS transistors 462, 464.

The second source/drain terminal of the sixth PMOS transistor 466 is connected to a source/drain terminal of a first NMOS transistor 482 of the current mirror 480. The gate of sixth PMOS transistor 466 is connected to receive the pixel signal $V_{sig}$, where the sixth PMOS transistor 466 acts as a source follower transistor for the second branch 461. The second source/drain of the sixth PMOS transistor 466 is also coupled to node B and a second input of the comparator 470. The output of the comparator 470 is connected to a first input of the NOR gate 472. The non-inverted second clock signal /PHI2 is connected to a second input of the NOR gate 472.

In operation, the first clock signal /PHI1 is applied to the gate of the fourth PMOS transistor 462 while the second clock signal /PHI2 is applied to the gate of the fifth PMOS transistor 464. As set forth above, the clock signals /PHI1, /PHI2 are non-overlapping complementary signals. The two PMOS transistors 462, 464 act as switches, where the fourth PMOS transistor 462 is controlled by the first clock signal /PHI1 and the fifth PMOS transistor 464 is controlled by the second clock signal /PHI2. Activating the fourth PMOS transistor 462 (i.e., closing the switch) immediately after deactivating the fifth PMOS transistor 464 (i.e., opening the switch) will charge the capacitor 468. Similarly, deactivating the fourth PMOS transistor 462 (i.e., opening the switch) immediately before activating the fifth PMOS transistor 464 (i.e., closing the switch) will discharge the capacitor 468.

Using the non-overlapping complementary clock signals /PHI1, /PHI2 to open and close the "switches" (i.e., transistors 462, 464) causes the capacitor 468 to simulate a resistor (e.g., resistor $R_s$ in FIG. 5B) with an equivalent resistance equal to 1/f·C, where C is the capacitance of the capacitor 468 and f is the frequency of the clock signals /PHI1, /PHI2. As set forth above, by varying the frequency f, the resistance may be adjusted or modulated as desired. A pixel signal current $I_S$ based on the resistance of the second branch 461 and the $V_{sig}$ voltage level flows through the second branch 461 to the comparator 470.

The regulation branch 473 comprises three PMOS transistors 474, 475, 476 and a capacitor 478. The seventh PMOS transistor 474 is connected between the supply voltage $V_{AA}$ and a source/drain terminal of the eighth PMOS transistor 475. The gate of the seventh PMOS transistor 474 is connected to the first clock signal /PHI1. The eighth PMOS transistor 475 has a second source/drain terminal connected to a source/drain terminal of the ninth PMOS transistor 476. The gate of the eighth PMOS transistor 475 is connected to the output of the NOR gate 472. The third capacitor 478 is connected between a ground potential and the connection between the seventh and eighth PMOS transistors 474, 475.

The second source/drain terminal of the ninth PMOS transistor 476 is connected to node A and the first input of the comparator 470. The gate of ninth PMOS transistor 476 is connected to receive a reference voltage $V_{ref}$. Preferably, reference voltage $V_{ref}$ is common to all columns of a pixel array of the imager. The ninth PMOS transistor 476 acts as a source follower transistor for the regulation branch 473.

In operation, the first clock signal /PHI1 is applied to the gate of the seventh PMOS transistor 474. The output of the NOR gate 472, which is either high or pulses low while PHI2 is low depending upon the output of the comparator 470, is applied to the gate of the eighth PMOS transistor 475. The two PMOS transistors 474, 475 act as switches, where the seventh PMOS transistor 474 is controlled by the first clock signal /PHI1 and the eighth PMOS transistor 475 is controlled by the output of the NOR gate 472 (as clocked by PHI2). Activating the seventh PMOS transistor 474 (i.e., closing the switch) immediately after deactivating the eighth PMOS transistor 475 (i.e., opening the switch) will charge the third capacitor 478. Similarly, deactivating the seventh PMOS transistor 474 (i.e., opening the switch) immediately before activating the eighth PMOS transistor 475 (i.e., closing the switch) will discharge the third capacitor 478. The comparator 470 triggers the output of the NOR gate 472 when the reset signal current $I_R$ is less than the pixel signal current $I_S$ (but only when the second clock signal /PHI2 has a logic state that would activate the eighth PMOS transistor 475).

Using the non-overlapping complementary clock signals /PHI1, /PHI2 (and the output of the comparator 470) to open and close the "switches" (i.e., transistors 474, 475) causes the capacitor 478 to simulate a resistor (e.g., resistor $R_x$ in FIG. 5B) with an equivalent resistance equal to 1/f·C, where C is the capacitance of the capacitor 478 and f is the frequency of the clock signals /PHI1, /PHI2. As set forth above, by varying the frequency f, the resistance may be adjusted or modulated as desired. An adjustment current $I_A$ based on the resistance of the regulation branch 473 and the reference voltage $V_{ref}$ flows through the regulation branch 473 to node A where it combines with the reset current $I_R$. Thus, as is described below in more detail, the regulation branch 473 regulates the sum of the adjustment current $I_A$ and $I_R$ to be equal to the sum of an offset current $I_B$ and signal current $I_S$ by adjusting $I_A$ based on the outputs of the comparator 470, NOR gate 472 and the reference voltage $V_{ref}$.

The offset branch 491 comprises three PMOS transistors 492, 494, 496 and a capacitor 498. The tenth PMOS transistor 492 is connected between the supply voltage $V_{AA}$ and a source/drain terminal of the eleventh PMOS transistor 494. The gate of the tenth PMOS transistor 492 is connected to the first clock signal /PHI1. The eleventh PMOS transistor 494 has a second source/drain terminal connected to a source/drain terminal of the twelfth PMOS transistor 496. The gate of the eleventh PMOS transistor 494 is connected to the second clock signal /PHI2. The fourth capacitor 498 is connected between a ground potential and the connection between the tenth and eleventh PMOS transistors 492, 494.

The second source/drain terminal of the twelfth PMOS transistor 496 is connected to node B and the second input of the comparator 470. The gate of twelfth PMOS transistor 496 is connected to receive a offset voltage $V_{off}$. The offset voltage $V_{off}$ may be common to all columns of a pixel array of the imager or may be set specifically for a given column of the pixel array. In either case, the applied offset voltage $V_{off}$ should be at least as large as the largest observed negative column offset of the columns to which the offset voltage $V_{off}$ will be applied. The twelfth PMOS transistor 496 acts as a source follower transistor for the offset branch 491.

In operation, the first clock signal /PHI1 is applied to the gate of the tenth PMOS transistor 492 while the second clock signal /PHI2 is applied to the gate of the eleventh PMOS transistor 494. As set forth above, the clock signals /PHI1, /PHI2 are non-overlapping complementary signals. The two PMOS transistors 492, 494 act as switches, where the tenth PMOS transistor 492 is controlled by the first clock signal /PHI1 and the eleventh PMOS transistor 494 is controlled by the second clock signal /PHI2. Activating the tenth PMOS transistor 492 (i.e., closing the switch) immediately after deactivating the eleventh PMOS transistor 494 (i.e., opening the switch) will charge the fourth capacitor 498. Similarly, deactivating the tenth PMOS transistor 492 (i.e., opening the switch) immediately before activating the eleventh PMOS transistor 494 (i.e., closing the switch) will discharge the fourth capacitor 498.

Using the non-overlapping complementary clock signals /PHI1, /PHI2 to open and close the "switches" (i.e., transistors 492, 494) causes the capacitor 498 to simulate a resistor (e.g., resistor $R_B$ in FIG. 5B) with an equivalent resistance equal to 1/f·C, where C is the capacitance of the capacitor 498 and f is the frequency of the clock signals /PHI1, /PHI2. As set forth above, by varying the frequency f, the resistance may be adjusted or modulated as desired. An offset current $I_B$ based on the resistance of the offset branch 491 and the offset voltage $V_{off}$ flows through the offset branch 491 to node B where it combines with the signal current $I_S$. Thus, as is described below in more detail, the offset branch 491 results in the summing of currents $I_B$ and $I_S$. $I_A$ is regulated so that the sum of $I_A$ and $I_R$ is equal to the sum of $I_B$ and $I_S$.

The operation of the sensing circuit 450 is now explained in more detail with reference to FIG. 5B. FIG. 5B illustrates a sigma-delta analog-to-digital converter 500 using the FIG. 5A sigma-delta sensing circuit 450. Portions of the sensing circuit 450 illustrated in FIG. 5A have been replaced by their functional equivalents in FIG. 5B. For example, in FIG. 5B, a first resistor $R_i$ replaces the first switched capacitor 458 and the first and second PMOS transistors 452, 454 shown in FIG. 5A. Likewise, in FIG. 5B, a second resistor $R_s$ replaces the second switched capacitor 468 and the fourth and fifth PMOS transistors 462, 464 shown in FIG. 5A. In FIG. 5B, a third resistor $R_x$, shown as an adjustable resistor, replaces the third switched capacitor 478 and the seventh and eighth PMOS transistors 474, 475 shown in FIG. 5A. Also, in FIG. 5B, a fourth resistor $R_B$ replaces the fourth switched capacitor 498 and the tenth and eleventh PMOS transistors 492, 494 shown in FIG. 5A. The NOR gate 472 and the smoothing capacitors 457, 467, 477, 497 are also not shown in FIG. 5B. The illustrated analog-to-digital converter 500 also includes a counter 490 connected to the output of the comparator 470.

The sensing circuit 450, and as such, the analog-to-digital converter 500, operates based on a sigma-delta modulation approach. In principle, the sensing circuit 450 attempts to get the reset signal current $I_R$ plus adjustment current $I_A$ to be equal to the sum of the pixel signal current $I_S$ and the offset current $I_B$. Since typically it is most likely that the reset signal current $I_R$ will be less than the sum of the pixel signal current $I_S$ and the offset current $I_B$, the sensing circuit 450 adds the adjustment current $I_A$ to the reset signal current $I_R$ during the sense operation.

This is achieved by modulating the resistance of the regulation branch 473 such that the branch creates a suitable adjustment current $I_A$ over the course of the sensing operation. The counter 490 keeps track of the number, M, of times the resistance $R_x$ is adjusted over a predetermined number of clock cycles N. The number of clock cycles N is typically equal to $2^n$, where n is the number of bits of resolution in the analog-to-digital converter 500. The number M of times the resistance $R_x$ is changed directly corresponds to the difference between the pixel signal voltage $V_{sig}$ and the reset signal voltage $V_{rst}$. As such, the number M of times the resistance $R_x$ is changed will be used by the counter 490 to generate a digital code analog-to-digital converter code corresponding to the actual light impinging on the pixel.

To counter the possibility that a pixel signal $V_{sig}$ may have a negative column offset, an appropriate offset voltage $V_{off}$ is applied to the twelfth PMOS transistor 496. The offset voltage $V_{off}$, combined with the equivalent fourth branch resistance $R_B$, generates an offset current $I_B$. Offset current $I_B$ adds with signal current $I_S$ so that comparator 470 perceives a corrected pixel signal $V_{sig}$. The difference between the corrected pixel signal $V_{sig}$ (i.e., $V_{sig}$ summed with $V_{off}$) is found by adjusting $I_A$ so that the sum of $I_A$ and $I_{rst}$ is equal to the sum of $I_B$ and $I_S$.

The operation of the sensing circuit 450 can be expressed by the following current equations:

$$\frac{V_{AA} - V_{off} - V_{tp496}}{R_B} + \frac{V_{AA} - V_{sig} - V_{tp466}}{R_s} = \frac{V_{AA} - V_{rst} - V_{tp456}}{R_i} + \frac{V_{AA} - V_{ref} - V_{tp476}}{R_x}$$

Equation 7.

where $V_{tp466}$ is the threshold voltage of the sixth PMOS transistor 466, $V_{tp456}$ is the threshold voltage of the third PMOS transistor 456, $V_{tp476}$ is the threshold voltage of the ninth PMOS transistor 476 and $V_{tp496}$ is the threshold voltage of the twelfth PMOS transistor 496. Preferably, $R_s = R_B = R_i$. Thus, Equation 7 becomes:

$$(V_{AA} - V_{off} - V_{tp496}) + (V_{AA} - V_{sig} - V_{tp466}) - (V_{AA} - V_{rst} - V_{tp456}) = (V_{AA} - V_{ref} - V_{tp476})\frac{R_i}{R_x}$$

Equation 8.

It is known that the ratio of the resistance $R_i$ to resistance $R_x$ is proportional to the number, M, of times the resistance $R_x$ is adjusted over a predetermined number of clock cycles N. In addition, $V_{tp466}$ is assumed equal to $V_{tp456}$. As such, Equation 8 becomes:

$$\frac{R_i}{R_x} = \frac{M}{N} = \frac{V_{AA} - V_{off} - V_{sig} - V_{tp496} + V_{rst}}{V_{AA} - V_{ref} - V_{tp476}}$$

Equation 9.

From Equation 9, one sees that the number M of times the resistance $R_x$ is adjusted over a predetermined number of clock cycles N is proportional to both a desired pixel value, $V_{rst} - V_{sig}$, and an offset. The total offset is $V_{AA} - V_{tp496} - V_{off}$, which means that the offset voltage $V_{off}$ should be selected in relation to both $V_{AA}$ and the transistor voltage $V_{tp496}$. Similarly, reference voltage $V_{ref}$ also acts as a channel specific gain, related to both $V_{AA}$ and $V_{tp476}$, as seen from the denominator of Equation 9.

FIGS. 6A and 6B depict a multi-channel sigma-delta analog-to-digital converter 600, according to an exemplary embodiment of the invention. Each channel of the analog-to-digital converter 600 has a separate sigma-delta analog-to-digital converter 500 such as the one depicted in FIG. 5B. Each channel includes a reset branch 451a, 451b, a signal branch 461a, 461b, an adjustment branch 473a, 473b and an offset branch 491a, 491b. Each branch has an equivalent resistance $R_i$, $R_S$, $R_x$, $R_B$ and PMOS transistors 456a, 456b, 466a, 466b, 476a, 476b, 496a, 496b, as explained in relation to FIG. 5B. Each channel also includes a current mirror with NMOS transistors 482a, 482b, 484a, 484b and a comparator 470a, 470b, as explained in relation to FIG. 5B.

Each channel of the analog-to-digital converter 600 is configured to input a channel-specific offset voltage $V_{off}$. Multiple offset voltages $V_{off}$ are carried on offset voltage bus 430. A 3-bit latch 424a, 424b and a multiplexer 422a, 422b act to input the desired offset voltage from the offset voltage bus 430 to PMOS transistors 496a, 496b. Similarly, gain or reference voltages $V_{ref}$ are carried on a reference voltage bus 432 and are input to PMOS transistors 476a, 476b via a second 3-bit latch 428a, 428b and multiplexer 426a, 426b. In this way, each channel of the sigma-delta analog-to-digital converter 600 is regulated by an individual offset voltage $V_{off}$. All channels in the sigma-delta analog-to-digital converter 600 are regulated by a reference or gain voltage $V_{ref}$ that is preferably common to all channels and is selected from the reference voltages carried on the reference bus 432.

Figure 7:
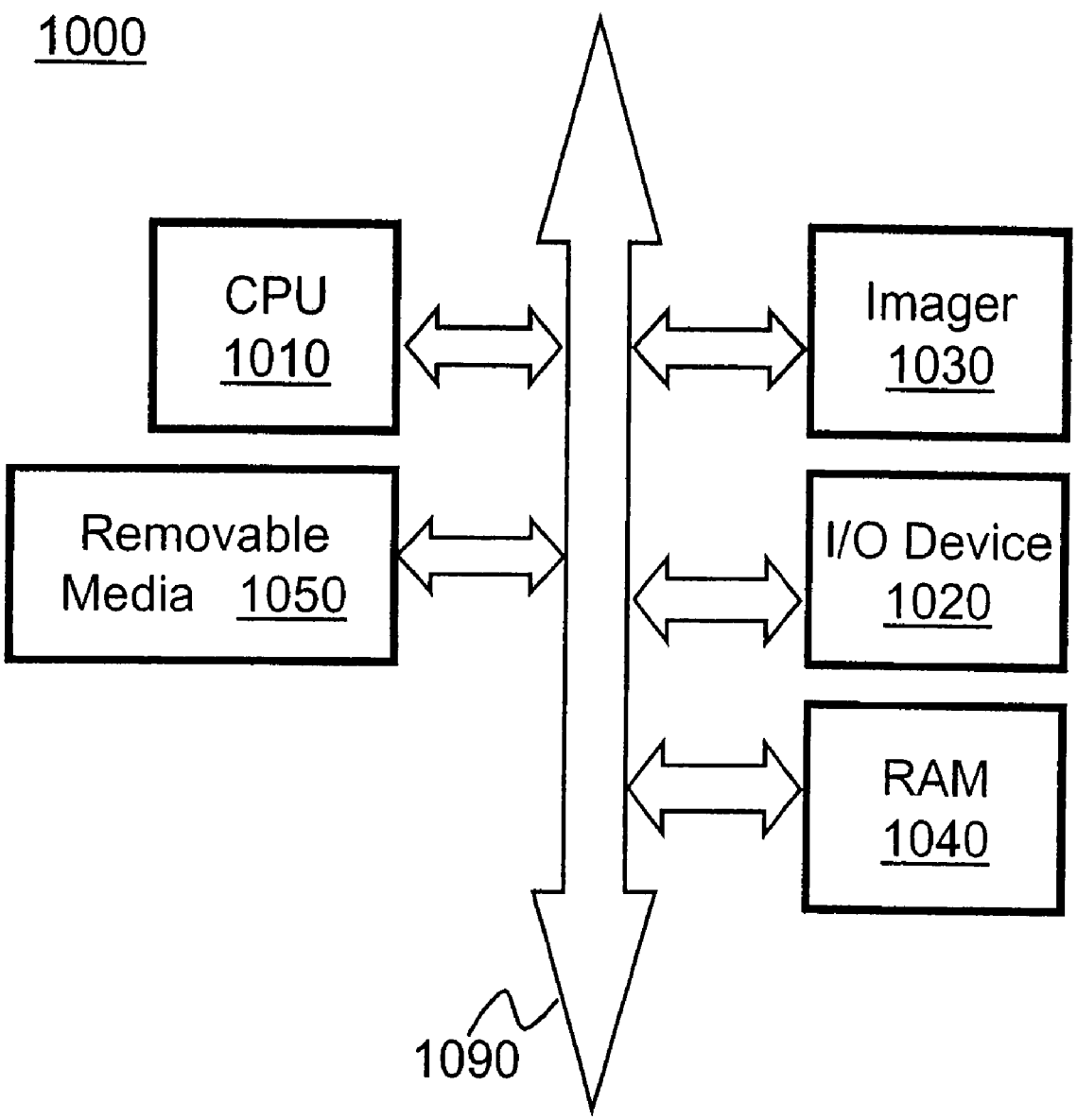
FIG. 7 is a typical processor system modified to include an imaging device according to an exemplary embodiment of the invention.

FIG. 7 shows a system 1000, a typical processor system modified to include an imaging device 1030 such as imaging device 100 of FIG. 1, but modified to include the invention in place of differential amplifier 162 and analog-to-digital converter 175. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and data compression system.

System 1000, for example a camera system, generally comprises a central processing unit (CPU) 1010, such as a microprocessor, that communicates with an input/output (I/O) device 1020 over a bus 1090. Imaging device 1030 also communicates with the CPU 1010 over the bus 1090. The processor-based system 1000 also includes random access memory (RAM) 1040, and can include removable memory 1050, such as flash memory, which also communicates with the CPU 1010 over the bus 1090. The imaging device 1030 may be combined with a processor, such as a CPU, digital signal processor, or microprocessor, with or without memory storage on a single integrated circuit or on a different chip than the processor.

What is claimed as new and desired to be protected by Letters Patent of the United States is:

1. A sensing circuit for an imager, the circuit comprising:
   a pixel reset line;
   a pixel signal line;
   an offset line;
   a reference line; and
   a comparator with a first and a second input, the first input coupled to the reference line and the pixel reset line and the second input coupled to the pixel signal line and the offset line.

2. The circuit of claim 1, wherein the reference line includes a resistance subject to sigma-delta modulation.

3. The circuit of claim 1, wherein the offset line includes a resistance produced by a switched capacitor circuit.

4. The circuit of claim 1, wherein the pixel signal line includes a resistance produced by a switched capacitor circuit.

5. The circuit of claim 1, wherein the pixel reset line includes a resistance produced by a switched capacitor circuit.

6. The circuit of claim 1, wherein the reference line includes a resistance produced by a switched capacitor circuit.

7. The circuit of claim 1, wherein the reference line is gated by a conditional output of the comparator.

8. The circuit of claim 7, wherein the conditional output is conditioned by a first clock line.

9. An analog-to-digital converter comprising:
   a sensing circuit comprising:
     a pixel reset line for carrying a reset signal;
     a pixel signal line for carrying an image signal;
     an offset line for carrying an offset signal;
     a reference line for carrying a reference signal; and
     a comparator with a first and a second input, the first input coupled to the reference line and the pixel reset line and the second input coupled to the pixel signal line and the offset line; and
   an output line for carrying an output signal representative of a difference between a sum of the image and offset signals and the reset signal.

10. The analog-to-digital converter of claim 9, wherein the reference line includes a resistance subject to sigma-delta modulation.

11. The analog-to-digital converter of claim 10, wherein the sigma-delta modulation corresponds to the output signal on the output line.

12. The analog-to-digital converter of claim 10, wherein the sigma-delta modulation only occurs when the sum of the image and offset signals is not equal to a sum of the reset and reference signals.

13. The analog-to-digital converter of claim 10, wherein the sigma-delta modulation is used to adjust the reference signal so that the sum of the image and offset signals is equal to a sum of the reset and reference signals.

14. The analog-to-digital converter of claim 9, wherein the reference line includes a resistance produced by a switched capacitor circuit.

15. The analog-to-digital converter of claim 9, wherein the reference line is gated by a conditional output of the comparator.

16. A method of operating an imager, the method comprising:
    sampling and holding a first signal and a second signal from a pixel;
    comparing a sum of the second signal and an offset signal with a sum of the first signal and a reference signal;
    adjusting the reference signal so that the sum of the first signal and the reference signal is at least as great as the sum of the second signal and the offset signal; and
    outputting a digital signal representing the amount of adjustment of the reference signal.

17. The method of claim 16, wherein the adjusting step comprises incrementally adjusting the reference signal based on a result of the comparing step.

18. The method of claim 16, wherein the adjusting step comprises adjusting the reference signal using sigma-delta modulation.

19. The method of claim 16, wherein the first signal is a reset signal and the second signal is an image signal.

20. The method of claim 16, wherein the adjusting step comprises modulating a resistance using a pulsed output of the comparing step.

* * * * *